(12) United States Patent
Bonilla et al.

(10) Patent No.: US 8,421,239 B2
(45) Date of Patent: Apr. 16, 2013

(54) CRENULATED WIRING STRUCTURE AND METHOD FOR INTEGRATED CIRCUIT INTERCONNECTS

(75) Inventors: Griselda Bonilla, Fishkill, NY (US); Elbert E. Huang, Carmel, NY (US); Satyanarayana V. Nitta, Poughquag, NY (US); Shom Ponoth, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 12/724,903

(22) Filed: Mar. 16, 2010

(65) Prior Publication Data

US 2011/0227232 A1    Sep. 22, 2011

(51) Int. Cl.
*H01L 29/40*    (2006.01)
(52) U.S. Cl.
USPC ............................ 257/775; 257/758; 257/774
(58) Field of Classification Search .................. 257/758, 257/774, 775
See application file for complete search history.

(56) References Cited

U.S. PATENT DOCUMENTS

| 6,288,450 | B1 * | 9/2001 | Narita et al. ................... 257/763 |
| 6,750,142 | B2 * | 6/2004 | Hieda ............................. 438/638 |
| 6,774,024 | B2 * | 8/2004 | Miyamoto et al. ............ 438/597 |
| 6,787,907 | B2 * | 9/2004 | Watanabe et al. .............. 257/758 |
| 6,946,716 | B2 * | 9/2005 | Andricacos et al. ........... 257/758 |
| 7,843,063 | B2 * | 11/2010 | Baker-O'Neal et al. ....... 257/751 |
| 7,868,456 | B2 * | 1/2011 | Suzuki et al. .................. 257/761 |
| 2004/0259348 | A1 * | 12/2004 | Basol et al. .................... 438/622 |
| 2006/0237853 | A1 * | 10/2006 | Nogami .......................... 257/775 |
| 2007/0035032 | A1 * | 2/2007 | Tsumura et al. ................ 257/775 |
| 2008/0191360 | A1 * | 8/2008 | Weidner et al. ................ 257/775 |

FOREIGN PATENT DOCUMENTS

JP    403022534    *    1/1991

* cited by examiner

*Primary Examiner* — James Mitchell
(74) *Attorney, Agent, or Firm* — Tutunjian & Bitetto, P.C.; Louis J. Percello

(57) ABSTRACT

A method for forming crenulated conductors and a device having crenulated conductors includes forming a hardmask layer on a dielectric layer, and patterning the hardmask layer. Trenches are etched in the dielectric layer using the hardmask layer such that the trenches have shallower portions and deeper portions alternating along a length of the trench. A conductor is deposited in the trenches such that crenulated conductive lines are formed having different depths periodically disposed along the length of the conductive line.

20 Claims, 7 Drawing Sheets

CRENULATED WIRING STRUCTURE AND METHOD FOR INTEGRATED CIRCUIT INTERCONNECTS

BACKGROUND

1. Technical Field

The present invention relates to wiring structures and methods for making the same, and more particularly to crenulated wiring to improve performance of integrated circuits in view of shrinking technology sizes.

2. Description of the Related Art

As technology shrinks, resistive-capacitive (RC) impedance associated with back end of line (BEOL) wiring increases dramatically. Such wiring, often referred to as "thin-wires", is mostly driven by the fact that resistance (as well as the resistivity) increases with decreasing dimensions. The resistance increase with decreasing pitch as technology shrinks causes many issues.

One way to attempt to control these issues is to increase the aspect ratio (AR) of the wires or increase volume of the conductors, both of which have severe drawbacks. In the first case, increasing AR increases capacitance. In addition, it becomes more difficult to fill higher aspect ratio trenches. Increasing conductor volume (or decreasing liner thickness) makes it difficult to deposit films below a certain thickness in a layer of a structure.

SUMMARY

A method for forming crenulated conductors and a device having crenulated conductors includes forming a hardmask layer on a dielectric layer, and patterning the hardmask layer. Trenches are etched in the dielectric layer using the hardmask layer such that the trenches have shallower portions and deeper portions alternating along a length of the trench. A conductor is deposited in the trenches such that crenulated conductive lines are formed having different depths periodically disposed along the length of the conductive line.

Another method for forming crenulated conductors includes forming a hardmask layer on a dielectric layer, forming pattern lines for etching the dielectric layer on the hardmask layer, masking first portions of the hardmask layer with a mask, the first portions being associated with shallower portions of a crenulated line, etching second portions of the hardmask layer to open up the hardmask layer down to the dielectric layer in areas where deeper portions of the crenulated line are to be formed, removing the mask, etching the first portions and the second portions selective to the pattern lines to form trenches having the shallower portions and the deeper portions, and depositing a conductor in the trenches such that crenulated conductive lines are formed having different depths periodically disposed along a length of the conductive line.

An integrated circuit device includes a dielectric layer formed on an underlying layer, the dielectric layer forming trenches therein such that the trenches have shallower portions and deeper portions alternating along the trench. A crenulated conductive line is formed in the shallower portions and deeper portions along the trench such that different depths are periodically provided along a length of the crenulated conductive line.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
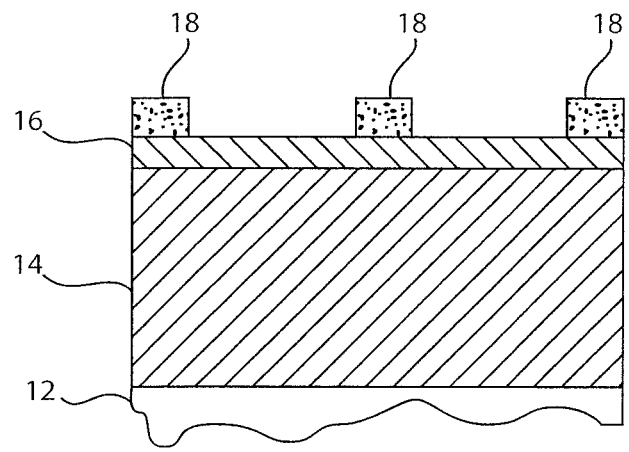
FIG. 1 is a cross-sectional view of an integrated circuit device having a dielectric layer, a hardmask layer and a line pattern formed thereon in accordance with one illustrative embodiment.

In accordance with the present principles, space available in a via level dielectric is employed to add or extend wiring in a regular, periodic fashion. Instead of increasing aspect ratio (AR), a depth of a wire conductor is periodically increased along a line or trench. This increase is staggered such that it is not adjacent to an increased depth portion of an adjacent line. Rather, the increased depths are staggered between adjacent lines. One advantage includes that the overall resistance of the line decreases without adding a significant amount of capacitance. Other advantages include, e.g., larger metal grains are possible in the increased depth regions, and electro-migration (EM) lifetimes are improved.

It is to be understood that the present invention will be described in terms of a given illustrative architecture having particular materials of fabrication and structures; however, other architectures, structures, substrate materials and process features and steps may be varied within the scope of the present invention.

Integrated circuits as described herein may be part of a design for an integrated circuit chip or even a printed wiring board. The design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, an interlevel dielectric layer 14 is illustratively shown to demonstrate one particularly useful embodiment in accordance with the present principles. It should be understood that the present principles include any wiring or metal lines or connection employed in the integrated circuit arts. For example, while a particular interlevel dielectric layer is shown and described, the present embodiments may be employed in multiple dielectric layers, employed in dielectric layer for contacts, employed in integrated circuit devices with semiconductor substrates or printed wiring boards, etc.

In the present example, dielectric layer 14 is formed on or over a substrate layer 12. Substrate layer 12 may include a semiconductor substrate, integrated circuit devices, a printed wiring board, other dielectric layers, other metal or conductive layers, etc. In the example depicted in FIG. 1, the interlevel dielectric layer 14 may include an oxide, such as a dense or porous SiCOH, silicon oxide, a nitride, such as silicon nitride, high dielectric constant dielectric, a glass such as boro-phosphorous silicate glass, a silsesquioxane such as a methyl or hydrogen silsesquioxane, an organic dielectric material or any other suitable dielectric.

The dielectric layer 14 will be described, for simplicity as including a SiCOH based material. After depositing or otherwise forming the dielectric layer 14, a hardmask layer 16 is formed. Hardmask layer 16 may include a material that is the same or similar to dielectric layer 14 in terms of its etch resistance. The etch qualities of hardmask layer 16 will be employed in later steps to provide a difference in depth for trenches or channels formed in layer 14 for the formation of crenulated conductor lines. Hardmask layer 16 is etched at different times at different locations to provide the crenulated conductive lines as will be explained hereinafter.

A line pattern 18 is provided on hardmask layer 16 for forming openings for conductive lines. The dielectric layer 14 and hardmask layer 16 have an etch rate that is selective to line pattern 18. Pattern lines 18 may include, e.g., a silicon nitride (nitride) or other suitable layer material. Pattern lines 18 may be formed by depositing a layer (e.g., nitride) and applying a resist material (not shown). The resist material is patterned to provide an etch mask by known lithographic processing techniques. Then, the layer is etched in accordance with the pattern to form lines 18 over layer 16.

Figure 2:
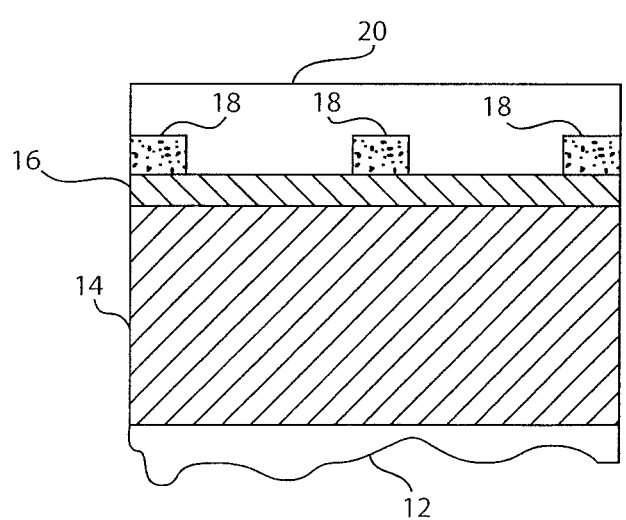
FIG. 2 is a cross-sectional view of the integrated circuit device of FIG. 1 having a mask layer formed thereon in accordance with the illustrative embodiment.

Referring to FIG. 2, the resist for patterning lines 18 is removed, and a mask layer 20 is deposited over the pattern lines 18 and layer 16. Mask layer 20 may include an oxide or other material that can be etched selectively with respect to pattern lines 18. The deposition of any of the layers described herein may be by known processes, such as, spin-on chemical vapor deposition (CVD), plasma enhanced CVD (PECVD), physical vapor deposition (PVD), epitaxy, etc.

Figure 3:
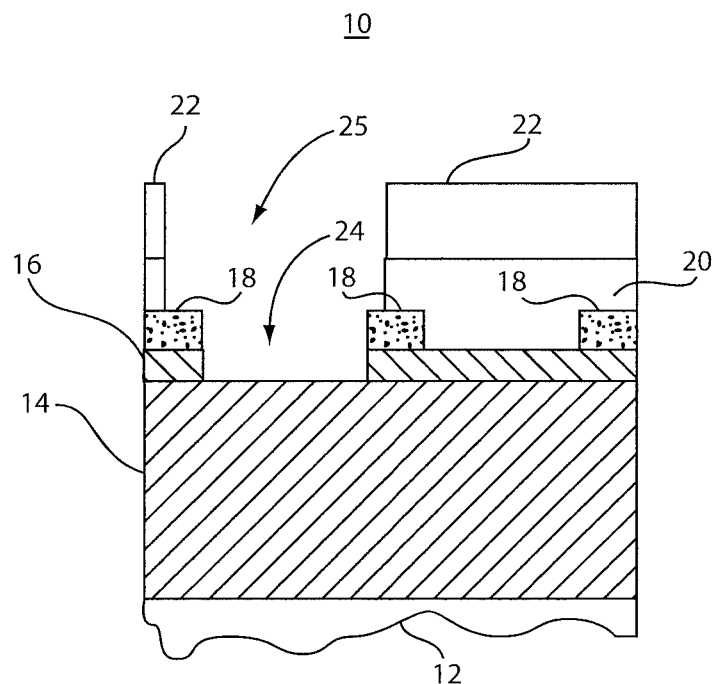
FIG. 3 is a cross-sectional view of the integrated circuit device of FIG. 2 having the mask layer patterned using a resist over deeper trench areas and the hardmask layer etched in accordance with the illustrative embodiment.

Referring to FIG. 3, a resist layer 22 or other masking layer is deposited over layer 20. The resist layer 22 is patterned in a checkerboard fashion using a lithographic process to provide openings 25 over areas where crenulated wires are to be formed that extend deeper into dielectric layer 14. The resist pattern formed in resist layer 22 has a large alignment tolerance with the lines 18. The edges on the resist pattern may coincide anywhere over the lines 18. An etching process is employed to open up layer 20 and layer 16 down to layer 14. The etching may include a reactive ion etch (RIE), a wet etch, a dry etch, etc. The etching preferable includes an anisotropic etch (e.g., RIE) to maintain an upper dimension of the trench 24 in layer 16. The etching is selective to lines 18 which define the upper opening of a trench 24 employed for the deep crenulated portion of the conductive lines to be formed in later steps.

Figure 4:
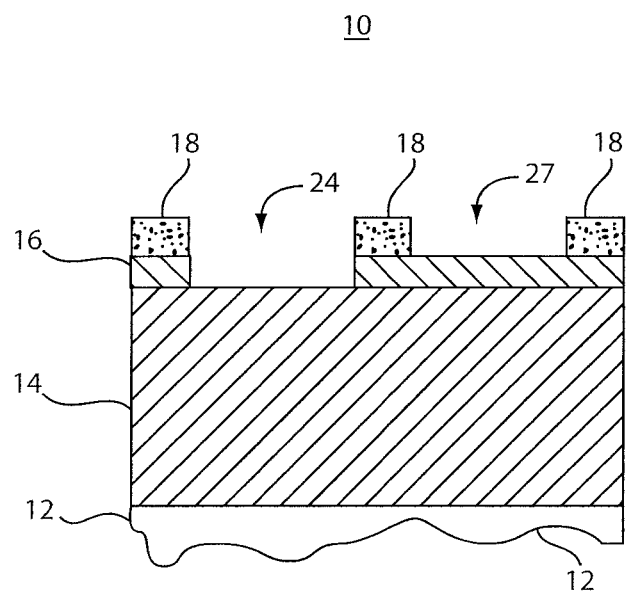
FIG. 4 is a cross-sectional view of the integrated circuit device of FIG. 3 having the mask layer and resist removed in accordance with the illustrative embodiment.

Referring to FIG. 4, the resist 22 and layer 20 are removed from layer 16 and lines 18 exposing trench 24 and area 27. Trench 24 is a location for a deeper portion of a crenulated wire while area 27 is a location for a shallower portion of an adjacent crenulated wire. Device 10 is etched selectively with respect to the lines 18. In this way, dielectric layer 14 is etched in trench 24 while layer 16 and eventually dielectric layer 14 are etched in area 27. The etching process may include a dry or wet etch.

Figure 5:
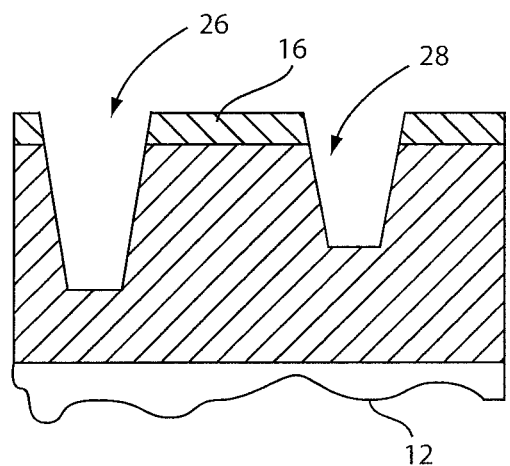
FIG. 5 is a cross-sectional view of the integrated circuit device of FIG. 4 having the hardmask layer and dielectric layer etched to concurrently form a deep portion and a shallow portion for trenches of adjacent conductive lines in accordance with the illustrative embodiment.

Referring to FIG. 5, trenches 26 and 28 are formed by the etching of dielectric layer 14 and layer 16. Layer 16 is employed to slow the etch depth of trench 28. In this way, trench 26 is formed as a deeper trench and trench 28 is shallower. The depth of the trench 26 is based on the etch rate of the dielectric layer 14 while the depth of trench 28 is based upon the etch rate and the thickness of layer 16 and the etch rate of the dielectric layer 14.

Figure 6:
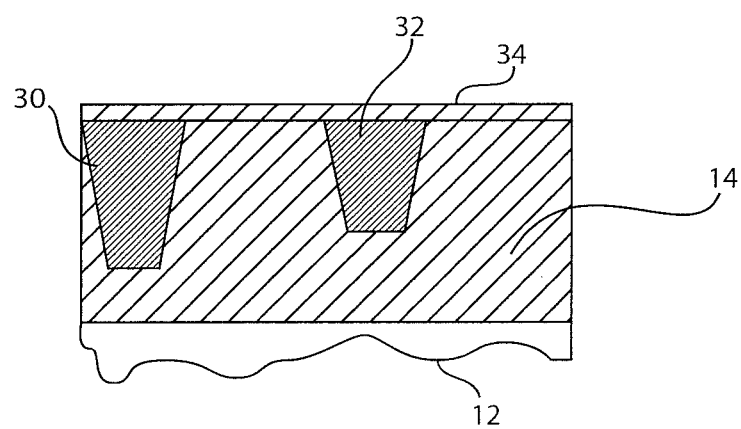
FIG. 6 is a cross-sectional view of the integrated circuit device of FIG. 2 showing adjacent crenulated lines formed in the dielectric layer in accordance with the illustrative embodiment.

Referring to FIG. 6, a conductor fill is performed to fill trenches 26 and 28 with a metal, e.g., copper, aluminum, etc., doped polysilicon, or other conductive material suitable for fanning conductive lines. Note that trenches 26 and 28 are illustrative of two adjacent conductor or metal lines. The conductor fill may be performed before removing layer 16 or after removing layer 16. After the conductor fill, an etch process or a chemical mechanical polishing (CMP) step may be performed to remove access conductor and to surface the device and form crenulated wires or conductive lines 30 and 32. A dielectric layer 34 may be formed over the crenulated lines 30 and 32. Processing can continue to complete device 10. This may include forming additional crenulated wire layers.

Figure 7:
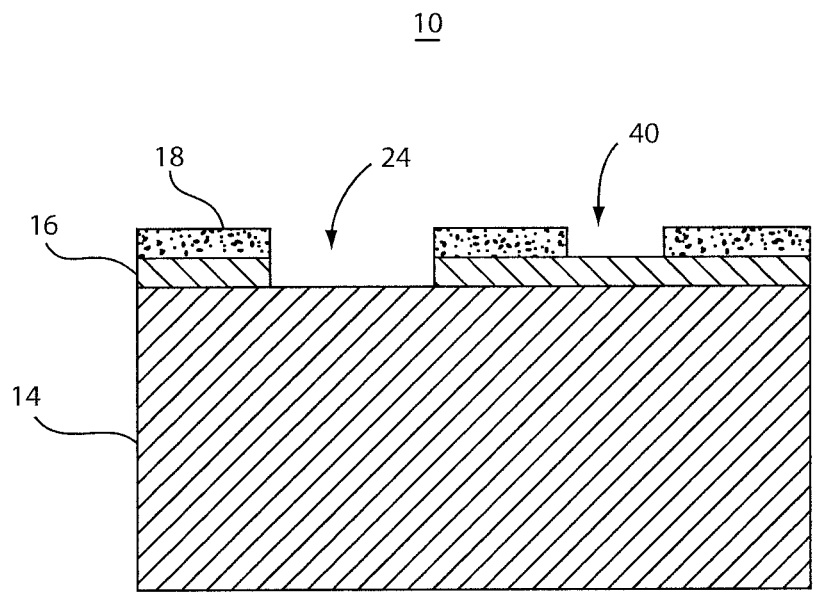
FIG. 7 is a cross-sectional view of the integrated circuit device of FIG. 3 showing an opening in a line pattern layer for locating a via hole or trench in accordance with the illustrative embodiment.

It should be understood that while the wires are crenulated, it may be advantageous to form via conductors and/or connections to via conductors at the same time as forming the crenulated wires. Referring to FIG. 7, a cross-sectional view of device 10 illustratively shows trench 24 formed in removed portions of layers 18 and 16 as described above. In addition, line pattern includes openings 40 for forming a via or vias into and through layer 14.

Figure 8:
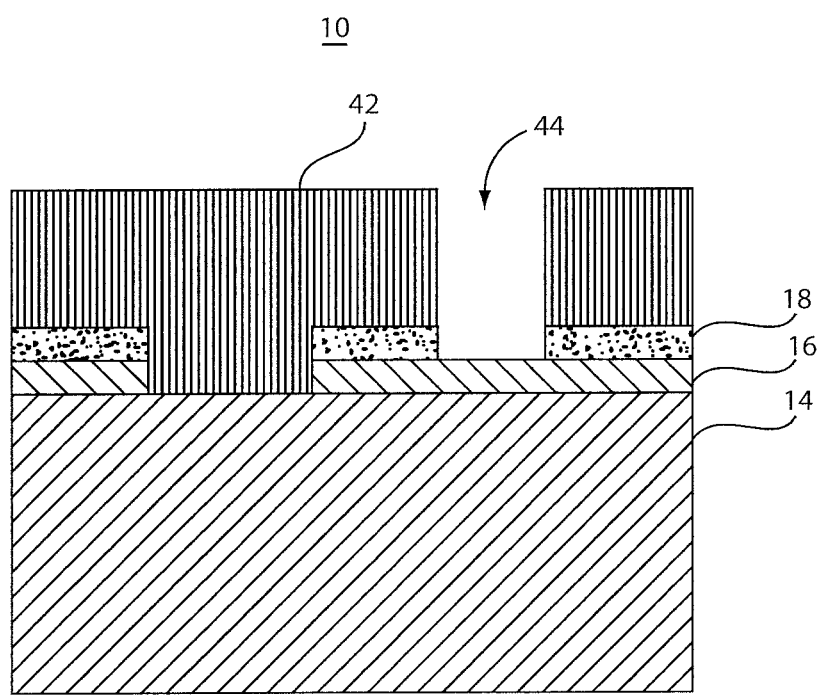
FIG. 8 is a cross-sectional view of the integrated circuit device of FIG. 7 showing an opening formed in a resist layer over the opening in the line pattern layer for locating the via hole or trench in accordance with the illustrative embodiment.
Figure 9:
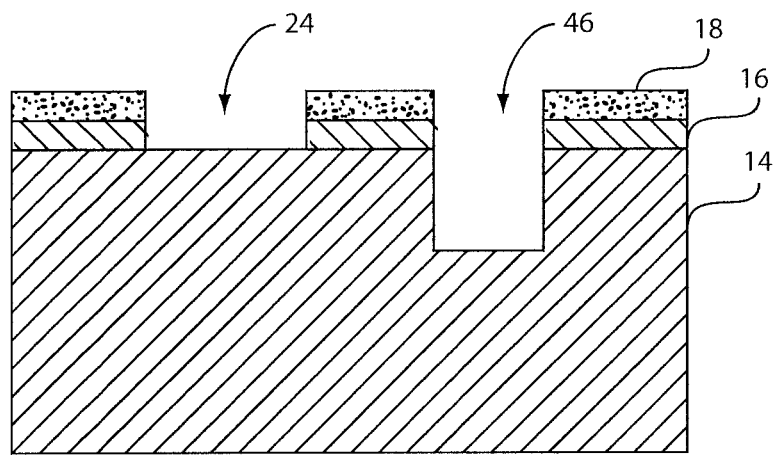
FIG. 9 is a cross-sectional view of the integrated circuit device of FIG. 8 showing a partially etched via trench in accordance with the illustrative embodiment.
Figure 10:
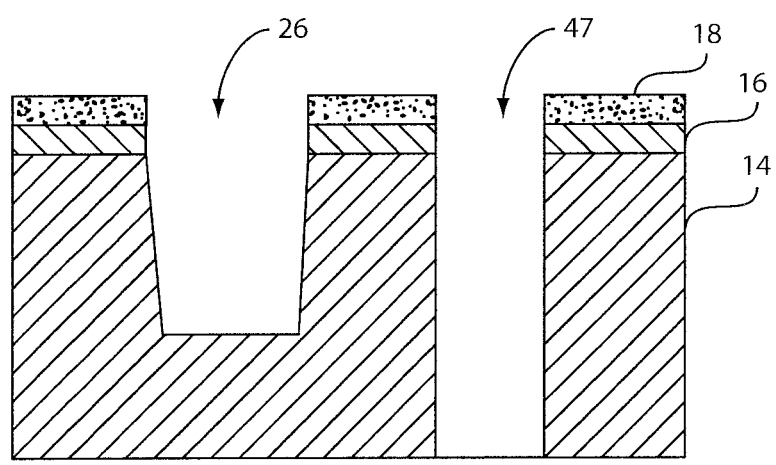
FIG. 10 is a cross-sectional view of the integrated circuit device of FIG. 9 showing a fully etched via trench which is concurrently etched with crenulated wire trenches in accordance with the illustrative embodiment.

Referring to FIG. 8, a resist layer or other mask 42 is formed over device 10. Openings 44 are formed in the resist layer 42 corresponding with openings 40 (FIG. 7). A partial or full via formation etch is performed. This etch may include the etching processes as described above or any suitable etch process to at least partially form via trench 46. In FIG. 9, after a partial via trench etch, the resist layer 42 is removed. Etching can now continue to concurrently form crenulated wire line trenches 26 (and trenches 28, not shown in FIG. 10) along with a via hole or trench 47 as depicted in FIG. 10. Contacts (not shown) are preferably formed in a same conductive deposition process with crenulated lines 30 and 32. While is it preferable to concurrently form lines 30 and 32 along with contacts, it is also possible to form contacts in a separate process as well.

It should also be noted that the crenulated wires may be between horizontal layers. In one example, a first layer includes horizontal displacement of the crenulated wires, and a second layer formed on the first layer, includes out of phase horizontal displacement of its crenulated wires relative to the wires in the first layer. The variations of the wires can be provided using lithography or other patterning techniques and layer-to-layer alignment processes.

The width of the crenulated wires is preferably about a minimum feature size achievable by lithography for a given technology. However, line patterning techniques may be employed to achieve sub-minimum feature sized widths. Widths larger than the minimum feature size may also be employed. Vertical crenulations preferably are formed in dielectric layers. The deeper portions of the crenulations should maintain a reasonable distance to avoid parasitic capacitances to components or features below the deeper crenulated portions.

It should be further understood that the crenulated wires described herein have deeper and shallower depth portions. However, it is contemplated that any number of depth portions may be employed. For example, three, four or more different depths may be employed. The different depths are also preferred to be maintained out of phase with adjacent lines.

Figure 11:
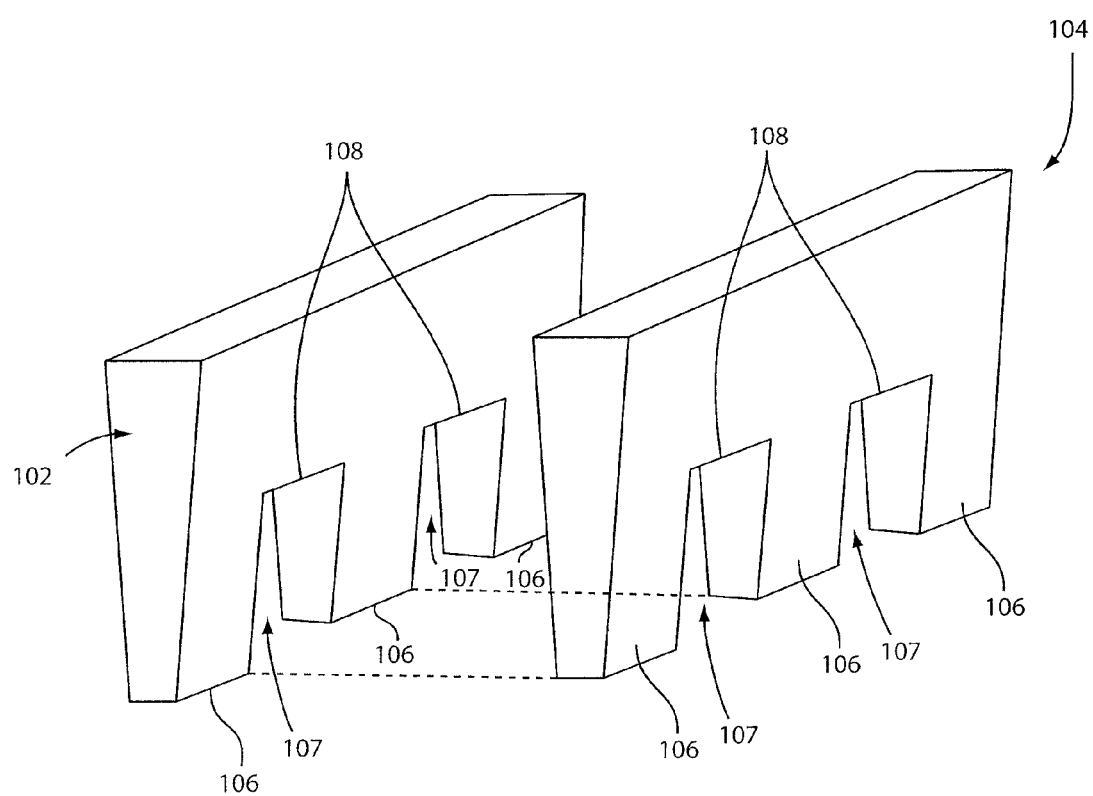
FIG. 11 is a perspective view showing portions of two adjacent crenulated lines in accordance with an illustrative embodiment.

Referring to FIG. 11, a perspective view of two adjacent crenulated wires 102 and 104 are illustratively shown. Wires 102 and 104 are shown out of phase relative to each other. In other words, a deeper portion 106 of wire 102 corresponds to a shallower portion 108 of wire 104. Wires 102 and 104 preferably employ space available in a via level dielectric. Wires 102 and 104 add or extend wiring in a regular, periodic fashion. The depth of the wire conductor is periodically increased along a line or trench at deeper portions 106. This increase is staggered such that portion 108 is preferably not adjacent to portion 106 of the adjacent line; rather, the increased depths are staggered between adjacent lines. One advantage includes that the overall resistance of the line decreases without adding a significant amount of capacitance. The resistance decrease happens due to two effects. The first is that the overall conductor volume increases with crenulation which decreases the resistance. The second is that with the larger volume of conductor in the crenulated spots, the local topography has larger grains which leads to lower resistivity due to decreased grain boundary scattering. Adjacent crenulated lines are disposed 180 degrees out of phase such that a deeper portion of a first line is next to shallower portions of a second line. This alternating pattern permits a greater amount of conductor to be employed with creating a significant increase in capacitance since the deeper portions of the conductors are directly adjacent to the dielectric in notched regions 107. Other advantages include, e.g., since larger grains exist in the increased depth regions, electromigration (EM) lifetimes are improved, among other things.

Figure 12:
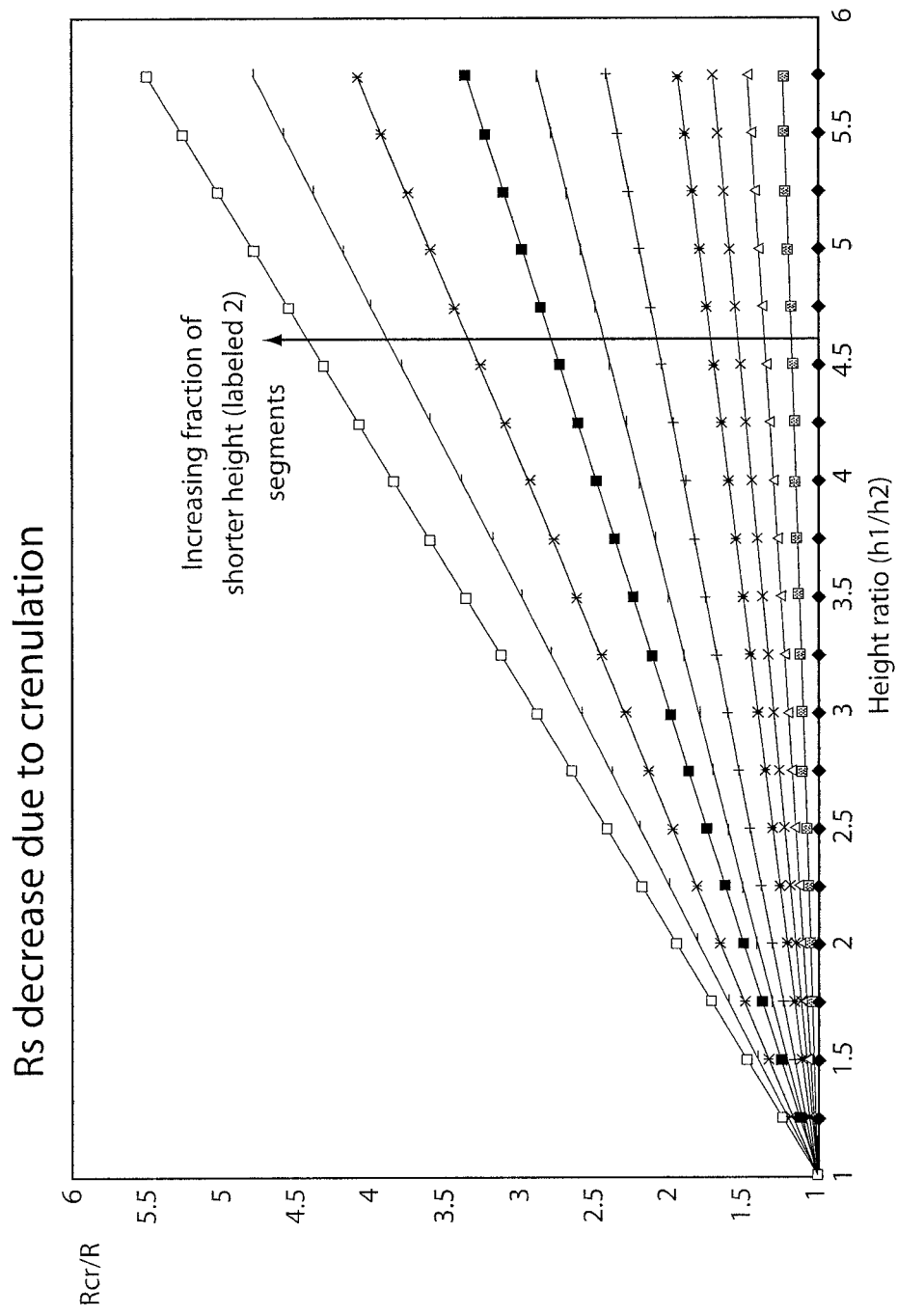
FIG. 12 is a plot of resistance ratio versus height ratio for crenulated line dimensions in accordance with the present principles.

Referring to FIG. 12, a chart illustratively showing resistance with crenulation $R_{crenulation}$ ($R_{cr}$) over series resistance (R) or $R_{cr}/R$ versus height ratio (h1/h2) where h1 is the height of the deeper portion of the crenulated wire and h2 is the shallower portion of the crenulated wire. The resistance R decreases with increasing fraction of crenulation.

Having described preferred embodiments of a crenulated wiring structure and method for integrated circuit interconnects (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming crenulated conductors, comprising:
   forming a hardmask layer on a dielectric layer;
   patterning the hardmask layer;
   etching trenches in the dielectric layer using the hardmask layer such that the trenches have shallower portions and deeper portions alternating along a length of the trench; and
   depositing a conductor in the trenches such that crenulated conductive lines are formed having different depths periodically disposed along the length of the conductive line, wherein depositing includes forming larger grains in the deeper portions than in the shallower portions;
   where a volume of the deeper portions is configured to permit formation of larger metal grains.

2. The method as recited in claim 1, wherein etching trenches includes etching through the hardmask layer and the dielectric layer to form the shallower portions such that a depth of the trench associated with the shallower portions is less than the trench associated with the deeper portions.

3. The method as recited in claim 1, wherein the crenulated conductive lines include alternating shallower portions and deeper portions along the length of the conductive line.

4. The method as recited in claim 3, further comprising forming adjacent crenulated conductive lines out of phase with respect to the alternating shallower portions and deeper portions along the length of the conductive line such that a crenulated conductive line has shallower portions next to deeper portions of an adjacent crenulated conductive line.

5. The method as recited in claim 1, wherein etching trenches is stopped before the trenches having the deeper portions break through the dielectric layer.

6. The method as recited in claim 1, wherein the hardmask layer includes at least one of a thickness and an etch rate selected to provide a depth difference between the shallower portions and the deeper portions during the step of etching trenches.

7. A method for forming crenulated conductors, comprising:
   forming a hardmask layer on a dielectric layer;
   forming pattern lines for etching the dielectric layer on the hardmask layer;
   masking first portions of the hardmask layer with a mask, the first portions being associated with shallower portions of a crenulated line;
   etching second portions of the hardmask layer to open up the hardmask layer down to the dielectric layer in areas where deeper portions of the crenulated line are to be formed;
   removing the mask;
   etching the first portions and the second portions selective to the pattern lines to form trenches having the shallower portions and the deeper portions; and
   depositing a conductor in the trenches such that crenulated conductive lines are formed having different depths periodically disposed along a length of the conductive line, wherein depositing includes forming larger grains in the deeper portions than in the shallower portions;
   where a volume of the deeper portions is configured to permit formation of larger metal grains.

8. The method as recited in claim 7, wherein etching the first portions and the second portions includes etching through the hardmask layer and the dielectric layer in the first portions such that a depth of the trench associated with the first portions is less than the trench associated with the second portions.

9. The method as recited in claim 7, wherein the crenulated conductive lines include alternating shallower portions and deeper portions along the length of the conductive line.

10. The method as recited in claim 9, further comprising forming adjacent crenulated conductive lines out of phase with respect to the alternating shallower portions and deeper portions along the length of the conductive line such that a crenulated conductive line has shallower portions next to deeper portions of an adjacent crenulated conductive line.

11. The method as recited in claim 7, wherein etching the first portions and the second portions is stopped before the trenches having the deeper portions break through the dielectric layer.

12. The method as recited in claim 7, wherein the hardmask layer includes at least one of a thickness and an etch rate selected to provide a depth difference between the shallower portions and the deeper portions during the step of etching the first portions and the second portions.

13. The method as recited in claim 7, wherein the crenulated conductive lines and connections to the crenulated conductive lines through the vias are concurrently formed.

14. An integrated circuit device, comprising:
   a dielectric layer formed on an underlying layer, the dielectric layer forming trenches therein such that the trenches have shallower portions and deeper portions alternating along the trench; and
   a crenulated conductive line being formed in the shallower portions and deeper portions along the trench such that:
      different depths are periodically provided along a length of the crenulated conductive line;
      larger grains are formed in the deeper portions than in the shallower portions of the crenulated conductive line; and
      a volume of the deeper portions of the crenulated conductive line is configured to permit formation of larger metal grains.

15. The device as recited in claim 14, wherein the shallower portions have a depth into the dielectric layer of less than the deeper portions.

16. The device as recited in claim 14, wherein the crenulated conductive lines include alternating shallower portions and deeper portions along the length of the conductive line.

17. The device as recited in claim 16, wherein adjacent crenulated conductive lines are out of phase with respect to the alternating shallower portions and deeper portions along the length of the conductive line such that a crenulated conductive line has shallower portions next to deeper portions of an adjacent crenulated conductive line.

18. The device as recited in claim 14, wherein the dielectric layer below the deeper portions has a thickness to maintain electric isolation with the underlying layer.

19. The device as recited in claim 14, wherein the device includes a plurality of layers having crenulated conductive lines.

20. The device as recited in claim 14, wherein the device includes a via trench formed in a same layer as the crenulated conductive lines.

* * * * *